United States Patent [19]

Chow

[11] Patent Number: 5,435,734
[45] Date of Patent: Jul. 25, 1995

[54] DIRECT INTEGRATED CIRCUIT INTERCONNECTOR SYSTEM

[76] Inventor: Vincent Chow, 7980 Kingsbury Dr., Hanover Park, Ill. 60103

[21] Appl. No.: 58,046

[22] Filed: May 4, 1993

Related U.S. Application Data

[63] Continuation of Ser. No. 773,717, Oct. 9, 1991, abandoned.

[51] Int. Cl.[6] .................. H01L 23/50; H01R 9/09
[52] U.S. Cl. ..................... 439/69; 257/730; 257/778; 361/744; 385/14; 439/71
[58] Field of Search ............... 439/66, 68, 69, 73, 439/78, 84, 387, 876, 886, 887, 64, 74, 75, 526, 70, 71; 361/735, 744, 745; 257/777, 778, 685, 686, 723, 730; 385/14, 75, 88

[56] References Cited

U.S. PATENT DOCUMENTS

| | | | |
|---|---|---|---|
| 3,239,719 | 3/1966 | Shower | 439/69 |
| 3,757,127 | 9/1973 | Dhaka | 385/88 |
| 4,373,778 | 2/1983 | Adham | 439/68 |
| 4,466,184 | 8/1984 | Cuneo et al. | 439/387 |
| 4,565,314 | 1/1986 | Scholz | 228/180.2 |
| 4,575,820 | 3/1986 | Barditch | 365/114 |
| 4,595,794 | 6/1986 | Wasserman | 174/138 G |
| 4,674,834 | 6/1987 | Margolin | 350/96.25 |
| 4,754,316 | 6/1988 | Reid | 257/777 |
| 4,813,129 | 3/1989 | Karnezos | 361/774 |
| 4,872,089 | 10/1989 | Ocken et al. | 361/388 |
| 4,875,617 | 10/1989 | Citowsky | 228/123 |
| 4,878,990 | 11/1989 | Dugan et al. | 156/630 |
| 4,916,806 | 4/1990 | Lorenzen | 29/837 |
| 4,930,001 | 5/1990 | Williams | 357/71 |
| 4,949,148 | 8/1990 | Bartelink | 357/74 |
| 4,953,061 | 8/1990 | Nitkiewicz | 361/417 |
| 5,010,389 | 4/1991 | Gansauge et al. | 357/67 |
| 5,046,953 | 9/1991 | Shreeve et al. | 439/68 |
| 5,065,282 | 11/1991 | Polonio | 439/68 |
| 5,083,007 | 1/1992 | Spletter et al. | 219/121.64 |
| 5,258,858 | 11/1993 | Chow | 358/484 |

OTHER PUBLICATIONS

Exhibit A is an article on new computer board, packaging, and connector designs published in EDN Magazine on Jul. 5, 1990.

Exhibit B is an article on engineering composite materials published in Electronic Engineering Times on Mar. 20, 1989.

Exhibit C is part of an article on three-dimensional computer architecture published in Electronic Engineering Times on Sep. 24, 1990.

Exhibit D is part of an article on three-dimensional packaging architecture published in Electronic Engineering Times on Apr. 16, 1990.

(List continued on next page.)

Primary Examiner—Steven C. Bishop
Attorney, Agent, or Firm—Willian Brinks Hofer Gilson & Lione

[57] ABSTRACT

A system for directly connecting one integrated circuit to another achieved by depositing gold onto the bonding pads of both integrated circuits, aligning the respective bonding pads and biasing both circuits into gas-tight, electrically conductive relation through the use of an initial compression force and a spring assembly. The gold bumps deposited on the bonding pads include ridges to ensure an optimal gas-tight seal. Alignment posts are also inserted through the host integrated circuit, which match notches cut into the periphery of the target integrated circuit, to ensure proper polarization and mating of the bonding pads of each integrated circuit. The integrated circuits and spring assembly are housed, and thus held together by, a carrier assembly. The carrier assembly also serves to dissipate heat generated by the integrated circuits, adapts for mounting on a printed circuit board, and includes a ferrule over an optical sensing area provided on the host integrated circuit.

35 Claims, 6 Drawing Sheets

OTHER PUBLICATIONS

Exhibit E is an advertisement for multilayer composite chip technology offered by TDK Corp. of America, published in EDN magazine on Apr. 28, 1990.

Exhibit F is part of an article on multichip modules published in Electronic Engineering Times on May 21, 1990.

Exhibit G is an advertisement for application specific hybrids offered by Phillips Circuit Assemblies, published in Electronic Engineering Times' 1990 Annual Report.

Exhibit H is part of an article on electron microscope technology for use with multichip module designs, published in Electronic Engineering Times.

"Magnetically Secured Integrated Circuit Package", by D. C. Landwer. *Western Electric Technical Digest,* No. 28 (Oct., 1972), pp. 25-26.

"Chip-Module (Board) Package for High Speed Computer Technology" by N. Breslau, *IBM Technical Disclosure Bulletin,* vol. 20, No. 11A (Apr., 1978), p. 4655.

"Chip-To-Chip Mounting System", *IBM Technical Disclosure Bulletin,* vol. 31, No. 2 (Jul., 1988), pp. 340-341.

DIRECT INTEGRATED CIRCUIT INTERCONNECTOR SYSTEM

This application is a continuation of application Ser. No. 07/773,717, filed Oct. 9, 1991, now abandoned.

FIELD OF THE INVENTION

This invention relates to termination methods for interconnecting integrated circuits ("IC's"), and, in particular, to a novel method and apparatus for connecting one IC to another IC with minimal interconnection required between the two.

BACKGROUND OF THE INVENTION

One of the most difficult challenges facing semiconductor vendors is the physical interconnections and terminations necessary for IC's to "talk" to the outside world. With integrated circuit technologies already in the sub-micron range it is common to see a complete computer fabricated on a single piece of silicon less than 0.3 inches square. As more functions are packed onto these IC's, the cost per function decreases. In fact, silicon IC's have become so cheap that the cost of the final product is dominated by complex interconnecting components. Interconnecting components, however, provide very little added value to the product, and greatly reduce electrical performance due to inherent capacitances, inductances and mismatched termination impedances.

A printed circuit board is commonly used to connect semiconductor components and other electrical parts. A typical personal computer can include as many as 100 integrated circuits, plus a number of discrete components such as crystals, capacitors and switches, all linked together on one or more printed circuit boards. Many of these IC's are individual, multi-pin IC's employing six to as many as 120 interconnection pins.

Each individual IC is packaged in a highly sophisticated packaging solution that "brings out" signal lines measured in millionths of an inch on the IC to external pins measured in tenths of an inch. When these signals reach another IC, they are again de-magnified to millionths of an inch dimensions. As a signal passes from one IC to another on a typical printed circuit board, this sequence is repeated many times. With the number of IC's included on a printed circuit board increasing, these magnification and demagnification techniques become costlier, making the IC's harder to produce and as a result more unreliable. Moreover, this interconnection approach is used for virtually all integrated circuits today. Thus, regardless of how small the IC itself becomes, interconnection requirements remain a major obstacle to smaller, and less expensive products.

Efforts have been made to simplify the interconnection schemes for integrated circuits. The goal has been to achieve the highest packing densities possible, i.e., to include the most functions or IC's on a printed circuit board. Modern solutions include the use of multi-layer printed circuit boards, high density connectors, and narrow line flexible circuitry. These techniques, however, are costly and have factors that limit overall performance.

Some of the more advanced techniques developed include multi-layer ceramic substrates, complex hybrids of silicon and ceramics, and multi-chip-module three-dimensional IC integration. Such techniques can achieve very fast electrical performance, but command a very high price. Thus, they are generally limited to applications where improvements in speed outweigh concerns over cost.

Since consumer demand for lighter, smaller and less costly products continues to be a driving force for new technology, an IC interconnection technique that can pack the greatest silicon horsepower into the smallest volume and at the lowest cost will present a substantial advantage over the prior art. One method of achieving greater functional integration without significantly impacting price or performance requirements would be to eliminate as much of the packaging surrounding each IC as possible. Attempts along these lines have been made, but each has its own disadvantages.

Chip-on-board is a technique where a single silicon die is directly mounted to a printed circuit board using conductive epoxy. A silastic coating is placed over the site to protect the chip-on-board structure from external contamination. Wire bonding, however, is required to electrically connect the silicon die to the printed circuit board. This packaging approach is highly efficient and very inexpensive, but has significant size limitations that prevent many chips from being simultaneously connected to a single printed circuit board.

Tape carrier bonding is another such attempt. This technique uses a patterned one-piece flex circuit that replaces individual bond wires and allows all of the bond wires for an IC to be connected in one operation. The process, however, requires costly machinery and has found limited popularity. In addition, other compromises have restricted tape carrier bonding to smaller IC packages.

Flip-chip bonding is a technique where bonding wires have been completely eliminated. In this process, a barrier metal (typically gold or solder reflow) is first plated over the bonding pads of a particular IC die. The die is then inverted and positioned face down on top of reciprocal bonding pad patterns located on a ceramic printed circuit board. A special backside viewing machine, which uses infrared light to "look" through the silicon, is used to precisely align the die to the ceramic board. Infrared heating is then applied to fuse the solder reflow situated between the chip and the ceramic printed circuit board. This technique eliminates bonding wires, but is highly labor intensive and therefore quite costly.

It would, therefore, be advantageous to have an IC interconnection technique that eliminates bonding wires and self-contained packaging solutions, which can be employed at low cost and with minimal effort. Such a technique would connect one IC directly to another IC, and would align the two without highly labor-intensive, expensive machines.

SUMMARY OF THE INVENTION

The IC interconnection technique of this invention eliminates bonding wires and can be performed without expensive machinery or time-consuming labor. The interconnection technique of this invention therefore allows the connection of one IC directly to another IC. According to the invention, the first and second integrated circuits each have one or more bonding regions, and each bonding region includes a malleable, electrically conductive raised bump disposed thereon. The arrangement of the bonding regions on the first integrated circuit is the mirror image of the arrangement of the bonding regions on the second integrated circuit so that the raised bumps on the first IC align with the raised bumps on the second IC when the two IC's are mated together. A gas-tight electrical connection is achieved between the IC's in the technique of this invention merely by mating and compressing the two IC's together so that the mating malleable bumps deform slightly.

The bonding pads on the respective IC's, which communicate information between the IC's, are thus directly connected to each other through the malleable bumps or connectors. It can be seen that this technique eliminates bonding wires.

In a preferred embodiment of this invention, expensive aligning equipment is eliminated by providing notches around the periphery of one of the IC's (which can conveniently be cut during wafer dicing) and providing alignment pins on the other IC. Each notch is positioned to accept an alignment pin, and the configuration of the notches and pins can be such that only one (i.e. the proper) mating relationship between the IC's is possible. Thus, the use of notches and alignment pins affords an inexpensive, accurate and fast alignment technique (to align the electrically conductive bumps) that eliminates complex alignment machines, labor-intensive assembly techniques, and soldering.

This invention, therefore, overcomes the disadvantages of the prior art packaged integrated circuits by eliminating most of the bonding and discrete interconnection previously required, and employing IC's directly in their chip form. This invention also produces an interconnection system that has increased speed potential, is reliable, is adaptable to most existing IC designs and still has a net cost advantage over the interconnection systems of the prior art.

The features and advantages of the invention will be further understood upon consideration of the following detailed description of the presently preferred embodiments of the invention taken in conjunction with the appended drawings.

BRIEF DESCRIPTION OF THE DRAWINGS

FIG. 9A shows the bumps prior to compression; FIG. 9B shows the initial compression of the bumps; and FIG. 9C shows the deformed bumps after complete compression.

DETAILED DESCRIPTION OF THE PRESENTLY PREFERRED EMBODIMENTS

Figure 1:
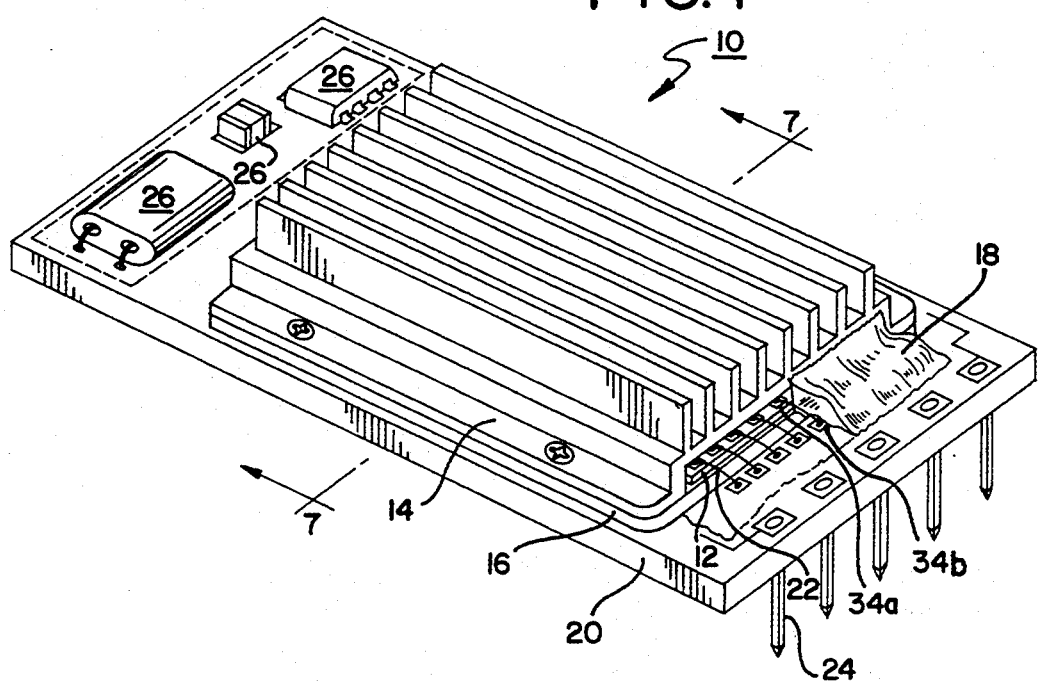
FIG. 1 is a perspective view of one presently preferred embodiment of an IC assembly employing the interconnection techniques of this invention.

With reference to FIG. 1, generally designated at 10 is one presently preferred embodiment of an integrated circuit assembly of this invention. Situated on the integrated circuit assembly 10 is an integrated circuit mother chip 12 contained within upper and lower carrier sub-assemblies 14, 16, which are preferably sealed by a silastic coating 18. Although silastic is a preferred sealant, those skilled in the art will appreciate that other sealants can be used without departing from the spirit and scope of the present invention.

Before the silastic sealant is deposited, however, the mother chip 12 is bonded to a micro-printed circuit board 20 using normal bonding wires 22. The micro-printed circuit board 20 connects to the main printed circuit board (not shown) of a host computer system through wire-wrap pins 24 or by soldering. As those skilled in the art will also appreciate, other forms of connections known in the art can be employed to connect the micro-printed circuit board 20 to the host platform. Included on the micro-printed circuit board 20 are also a limited number of discrete components collectively designated at 26.

Figure 2:
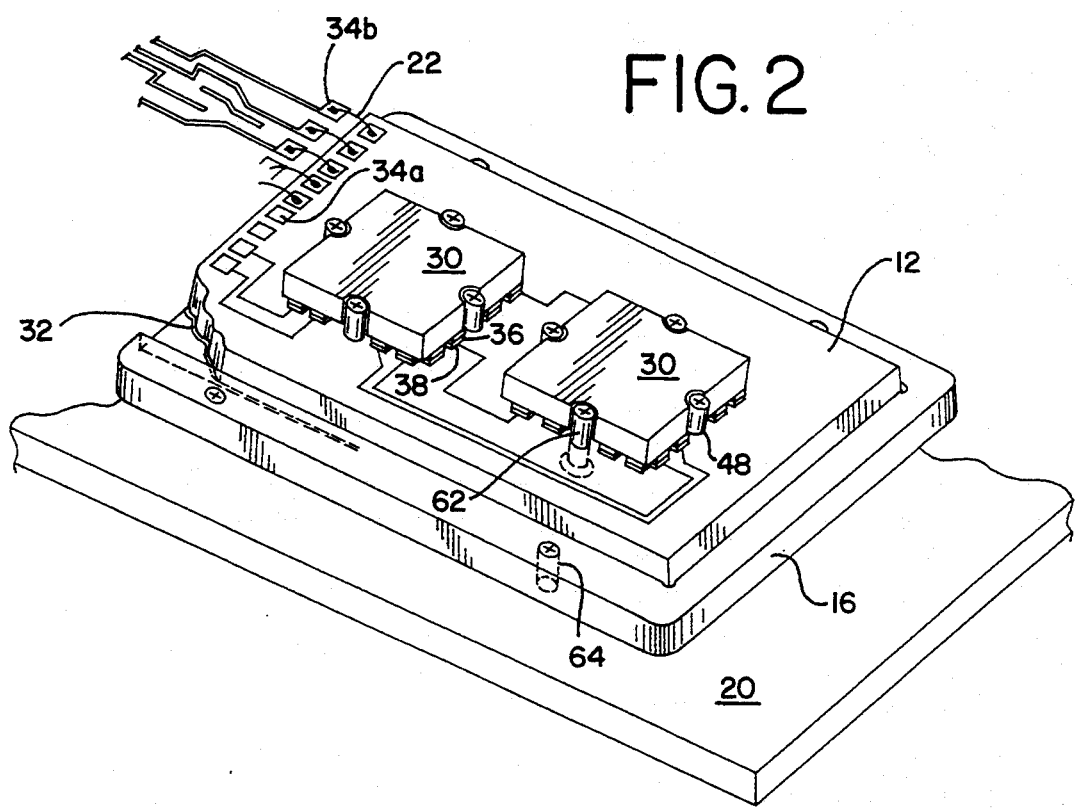
FIG. 2 is a perspective view partly in section of the mother and daughter chip configuration of the IC assembly shown in FIG. 1.

Directly connected to the mother chip 12 are one or more additional integrated circuits or daughter chips 30 (FIG. 2). As depicted in FIG. 2, the mother chip 12, situated on the lower carrier sub-assembly 16, is mated to the sub-assembly 16 using a special non-smearing heatsink compound 32. Along the periphery of the mother chip 12 are preferably included a plurality of bonding regions 34a that allow the communication of information to and from the integrated circuit assembly 10. The bonding regions 34a on the mother chip are connected to similar bonding regions 34b shown in FIGS. 1 and 2. The mother chip 12 can therefore be connected to other such mother chips 12 or, as mentioned, to the microprinted circuit board 20 through bonding wires 22 that attach to these bonding regions 34a, 34b.

In one preferred embodiment of the invention, the bonding regions 34 provided on the mother chips 12, or on the micro-printed circuit board 20, are 0.002" in diameter. Since nearly all of the functions already exist inside the IC assembly 10, fewer than six bond wires 22 are typically required (inclusive of power and ground) for these final connections.

A. MOTHER CHIP 12

The design of the mother chip 12 is largely defined by the user. The mother chip 12, therefore, is an application specific integrated circuit ("ASIC"), which performs the majority of functions needed in the integrated circuit assembly 10. When combined with the daughter chips 30, which supply any functions not provided on the mother chip 12, a fully operational IC assembly 10 is the result.

Devices not included on the mother chip 12, but included as daughter chips 30, are special function IC's 40 (FIG. 3) such as high density memories, special digital functions, or special linear circuits. These IC's can require specialized silicon starting materials or custom fabrication techniques, which may be difficult to integrate into a normal ASIC design such as the mother chips 12. However, since the mother chips 12 are user definable they can be designed so that these daughter functions are connected directly to the host ASIC according to the invention.

Figure 3:
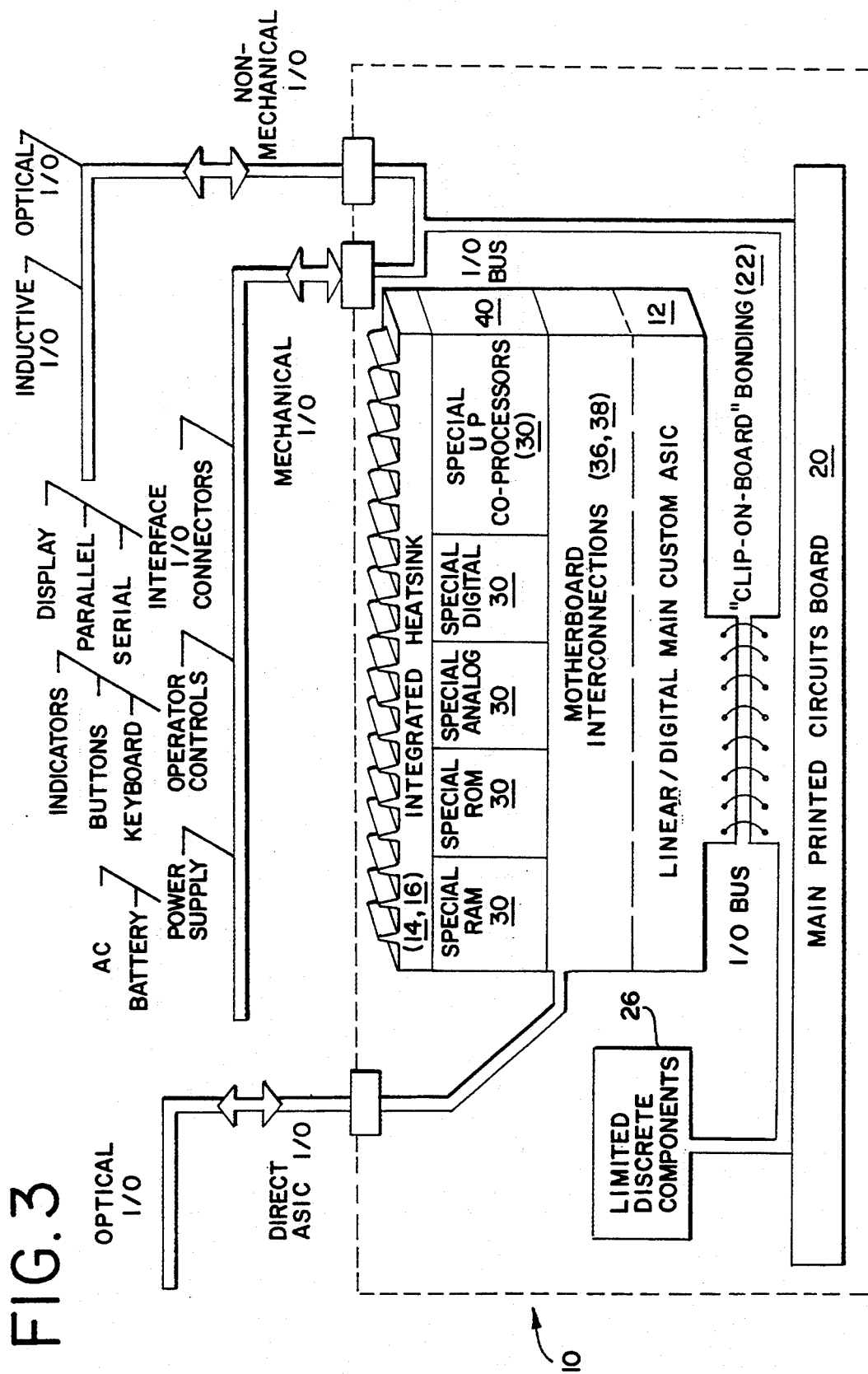
FIG. 3 is a functional block diagram of the IC assembly shown FIG. 1.

Depicted in FIG. 3 is a system block diagram for a digital computer system employing the integrated circuit assembly 10 of the invention. Shown functionally is the mother chip 12, which connects to the daughter chips 30 through the special motherboard interconnections of the invention. As described below, these motherboard interconnections comprise metal or alloy bumps 36, 38 deposited on the bonding pads of both the daughter chips 30 and the mother chip 12. Provided on top of the integrated circuit assembly 10 shown in FIG. 3, is an integrated heatsink comprised of the upper and lower carrier sub-assemblies 14, 16. The mother chip 12, including a variety of special daughter chips 30, is attached to the micro-printed circuit board 20 through a minimal number of wire bonds 22. Also connected to the micro-printed circuit board 20 is a limited amount of discrete electrical components depicted as block 26.

The integrated circuit assembly 10 may also preferably include additional connections to the outside environment. Specifically, these connections may include both the mechanical and non-mechanical input and output signals shown in FIG. 3. These signals provide power to the integrated circuit assembly 10, and connect the integrated circuit assembly 10 to external devices in the form of operator controls or serial and parallel peripherals. Also preferably provided in the integrated circuit assembly 10 is a direct signal interface to the mother chip 12. As will be described more fully below, this special interface allows a direct connection between the mother chip 12 and external optical devices through a fiber optic link or the like.

Although the mother chips 12 are largely user defined, a few constraints on their design are necessary according to the invention. Once the mother chip wafers 42 are fabricated (FIG. 4), they are subjected to a special gold plating process. This step deposits raised gold "bumps" 38 (see FIG. 2) onto the exposed bonding pads 44 (FIG. 4) of the mother chip 12. These gold bumps 38 will eventually be used to form gas-tight contacts with similar raised bumps 36 (FIG. 2) deposited on the bonding pads of the daughter chips 30.

Gold is the preferred metal for the bumps 36, 38, since it is an excellent conductor, does not oxidize and has a high immunity to the environment. This gold-on-gold connection ensures greater reliability of the interconnected system of this invention. Although gold is used in this preferred embodiment, it will be appreciated that other malleable and electrically conductive components, and alloys thereof, such as silver, solder, copper or indium can be employed without departing from the spirit and scope of the invention. As will be described more fully below in connection with FIG. 8, a preferred form for deposition of these bumps can be employed that creates an optimal gas-tight seal.

To accommodate the daughter chips 30, parking spots 46 (FIG. 4) are created on the mother chip 12 where each daughter chip 30 is to be "parked". Each parking spot 46 on the mother chip 12, therefore, contains a pattern of bonding pads 44 that will mirror the bonding pad arrangement of each daughter chip 30. Since the daughter chips 30 are preferably, generally available IC's, their pads will necessarily be of a size standard to the industry. As a result, providing a reciprocal pattern of bonding pads 44 on the mother chip 12 that match the bonding pads of the daughter chips 30 is readily accomplished.

Included around the perimeter of the parking spots 46 are strategically located 0,015" diameter holes 48. These holes 48 are preferably drilled by an ultraviolet or infrared cutting laser (not shown) during the wafer dicing stage in the manufacture of the mother chips 12. Such laser cutting is well known in the art for dicing silicon. The accuracy of the laser positioning system employed in these lasers can be better than 0.0001", and the hole repeatability can be better than one micron (0.000040"). Since the laser positioning system is referenced to the lithography pattern of the IC, very high accuracies can be obtained for the hole coordinates.

Figure 4:
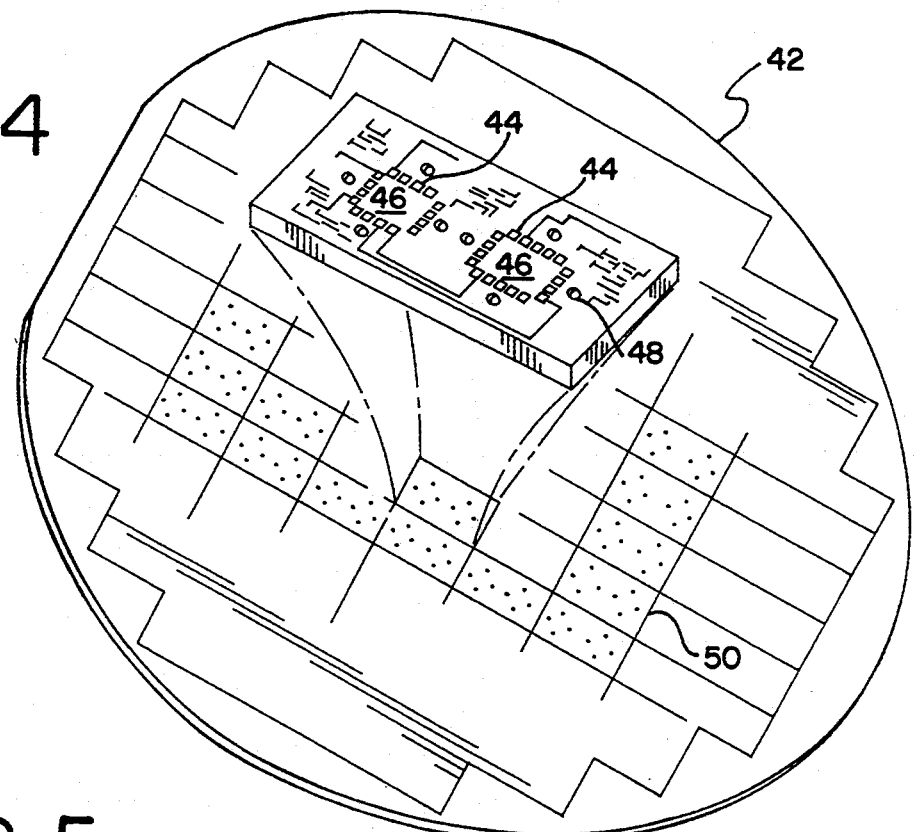
FIG. 4 is an enlarged exploded view of one of the mother chips shown in wafer form.

The laser beam is computer controlled and allows complex cuts to be made into the silicon. Laser cutting is fast and highly cost effective, and produces less stress on the silicon than conventional diamond sawing. Due to lattice damage, however, active silicon junctions must be at least 3 mils away from the laser cut lines 50 (FIG. 4). Conductor patterns, however, can be as close as 1 mil to this line.

B. DAUGHTER CHIPS 30

Figure 5:
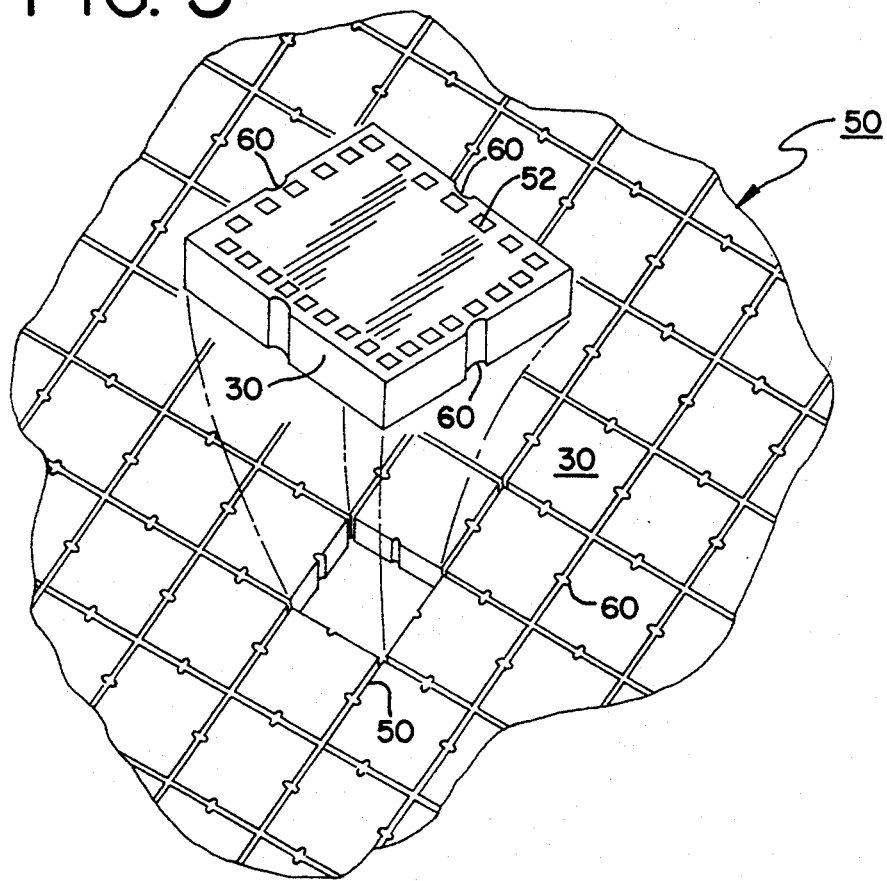
FIG. 5 is an enlarged exploded view of one of the daughter chips shown in wafer form.
Figure 8:
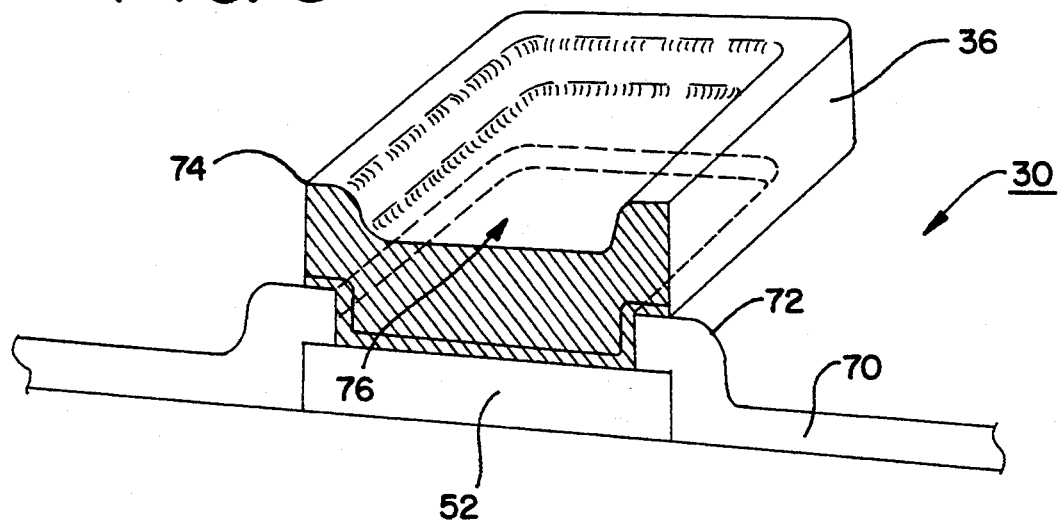
FIG. 8 is a cross-sectional view of one preferred embodiment of the metal or alloy bump employed in the invention.

The daughter chips 30 are preferably, generally available IC's that can be purchased from IC vendors in wafer form (see FIG. 5). Secondary processing is then performed on these wafers to create the gold bumps 36 (see FIG. 2) necessary for the inverted, gas-tight contacts of the invention. As a result of this secondary processing, each gold bump 36 actually becomes a raised metal island plated over the aluminum bonding pad areas 52 of each daughter chip 30. A process similar to that performed on the mother chips 12 is employed to create the gold bumps 38 deposited on each daughter chip 30. As mentioned, a preferred technique for depositing these bumps is shown in FIG. 8, and will be discussed below.

Figure 6:
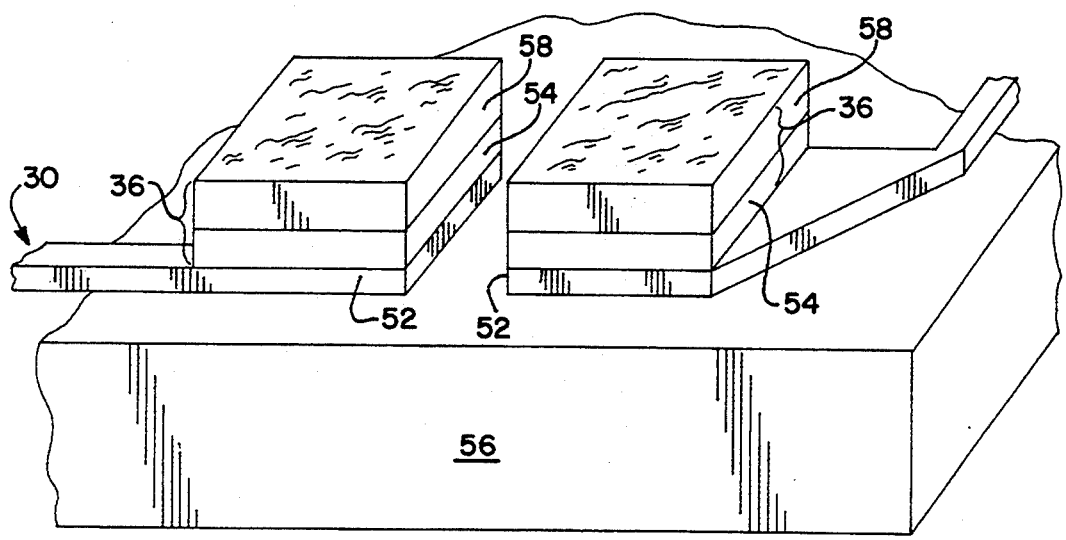
FIG. 6 is a detailed cross-sectional view of the interconnection technique of the invention.

The bump deposition process starts with the evaporation of preferably titanium-tungsten metal 54 (FIG. 6) onto the target silicon wafer 56. The titanium-tungsten metal 54 acts as an adhesion layer for the aluminum bonding pads 52 of either the mother chip 12 or daughter chips 30. In one preferred embodiment, pure gold 58 is then plated onto the titanium-tungsten metal 54 until a desired thickness is obtained. A photoresist mask (not shown) is then used to mask the bonding pad areas 52 while a wet chemical etch is performed to strip away the unmasked metal over the remainder of the chip. Thus, only the bonding pads 52 are left with raised islands (or "bumps") 36 of titanium-tungsten-gold metal 54, 58. These bumps 36 are preferably 25 microns (0,001") high. A similar plating operation is performed on the mother chip wafers 42 to form the bumps 38 deposited thereon.

A series of plating operations are required to simultaneously create the 25 micron high (0,001") preferred elevation on all bonding pads 52. When the mother chip 12 and the daughter chip(s) 30 are mated together, the mating bumps 36, 38 will create roughly 50 micron-high spacers. Since top surface IC elevations rarely exceed two microns above the bonding pads 44, 52, a clearance gap of 46 microns between the mother and daughter chips will result. With proper compression forces and the associated deformity to the bumps 36, 38, this gap is preferably reduced to 45 microns. This clearance is highly desirable because it serves to isolate the daughter chips 30 electrically from the mother chip 12.

Due to the characteristics of the plating process in one aspect of the invention, these islands are inherently very uniform and flat. When two "bumped" IC's are placed together face-to-face, their inherent flatness will produce the evenly distributed contact forces beneficial to the gas-tight contacts. Since the plated gold islands are microscopically flat, a near-perfect mate will occur when a daughter chip 30 is pressed face-to-face onto the mother chip 12. Because pure gold is highly malleable, the preferred contact pressure will cause a slight deformation of each bump 36, 38. As a result, a highly reliable gas-tight gold contact is created.

In one preferred embodiment of the invention, a special plating process is employed, which ensures an optimal gas-tight contact. Illustrated in FIG. 8 is a cross-sectional view of one gold bump 36 made according to this preferred technique. During the final manufacturing stages of either the mother chip 12 or the daughter chips 30, an aluminum bonding pad 52 is normally deposited on the surface of the IC to bring out signals for communication to the outside environment. After the aluminum pad 52 is deposited on the surface of the IC (and after the IC is masked and etched as appropriate), a silicon dioxide or equivalent glass passivation layer 70 is deposited over the surface of the chip 30. Holes are then cut through this glass passivation layer 70 to expose a surface of the bonding pad 52.

A normal by-product, however, of the glass passivation process is the appearance of a "step" 72 as the silicon dioxide layer 70 covers or overlaps the aluminum bonding pad 52. As shown in FIG. 8, when gold, or the preferred metal or alloy, is deposited on each bonding pad 52, a wall or ridge 74 is formed along the periphery of the bump 36 due to the silicon dioxide step 72. In a preferred embodiment of the invention, these metal or alloy bumps 36 can be manufactured in this fashion by the Aptos Corporation, Milpitas, Calif.

Figure 9A:
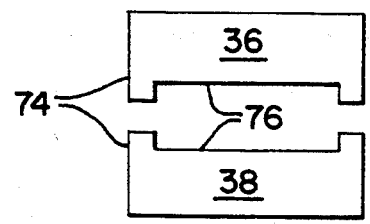
FIGS. 9A-9C show a cross-sectional view of the compression stages of two of the mating bumps shown in FIG. 8, where
Figure 9B:
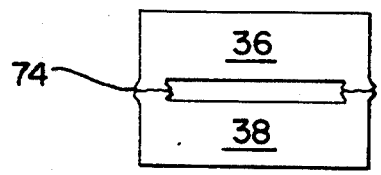
Figure 9C:
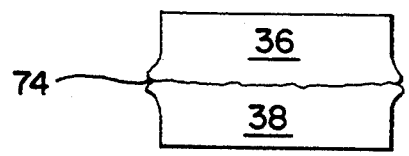

A gold bump of the type shown in FIG. 8 provides an optimal gas-tight interface due to the presence of the ridge 74 formed during the bumping process. Since the design, and thus manufacture, of the mother chip 12 is user defined, the thickness of the silicon dioxide layer 70 can be varied to create different heights for these ridges 74. Such variance of the height of the ridges 74 provides control over the gas-tight seal created when the two bumps 36 are compressed together. As shown in FIGS. 9A–9C, in the mating process, a daughter chip bump 36 is aligned to a mother chip bump 38 so that their respective ridges 74 align (FIG. 9A). As the mother and daughter chips are compressed together, these ridges 74 will initially deform, as shown in FIG. 9B. This initial deformation of the ridges 74 is accomplished prior to final assembly by an external press (not shown), and ensures that the gas-tight seal is achieved. As more compression force is applied, the sunken surface 76 of both bumps come into contact and also deforms (FIG. 9C). After the sunken surfaces 76 deform, the compression force can then be removed and a lesser seating force applied. However, after the compression force is removed, the gas-tight connection characteristics will still be maintained. The presence of the ridges 74, therefore, in combination with the compression force, ensures greater reliability of the integrated circuit assembly 10 of the invention.

When the daughter chip wafers 56 are cut into individual chips 30 (FIG. 5), the cutting laser (not shown) is also programmed to create shallow notches 60 at specific locations around the perimeter of each chip 30. The laser, which is under computer control, will cut curvatures and holes in the silicon as easily as it can cut straight lines. The notches 60 are preferably cut into inactive areas such as the scribe lines around the periphery of each daughter chip 30, and extend up to three mils into these inactive regions.

The placement of the notches 60 serves to polarize the daughter chips 30 so that only their proper orientation with respect to the mother chip 12 is possible when the two are combined. For example, the notches 60 can be cut into a pattern that would only allow a particular daughter chip 30 to align with its associated locating pins (discussed below) provided on the mother chip 12 while the daughter chip 30 is inverted to face the mother chip 12 and the bonding pads of the two chips are in proper alignment. These notches thus also ensure proper alignment of the daughter chips 30 to the mother chip 12. Once cut into die form, the daughter chips 30 are ready for final assembly.

C. CARRIER ASSEMBLY 14, 16

As mentioned above with reference to FIG. 1, a special two-piece carrier assembly 14, 16 is used to sandwich together the mother chip 12 with the daughter chips 30. To facilitate alignment of the daughter chips 30 to the mother chip 12, the lower carrier sub-assembly 16 preferably includes molded guide pins 62 (FIG. 2). In one preferred embodiment of the invention, these molded guide pins 62 are preferably 0.0145" in diameter and fit into and extend through the holes 48 drilled into the mother chips 12 (see FIG. 2). In this embodiment, the guide pins 62 are inserted through the mother chip 12 from its back side, and extend past the top or active side of the IC. This process of positioning the mother chips 12 onto the lower carrier sub-assembly 16 is preferably performed in one step and is highly conducive for use in automated machine assemblies that employ prefabricated preforms.

Figure 7:
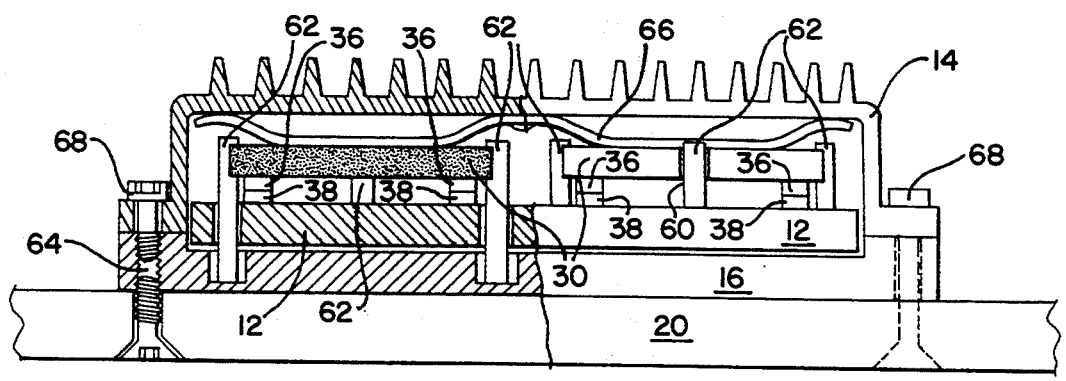
FIG. 7 is a cross-sectional view of one presently preferred embodiment of the interconnection device of the invention taken along the plane of line VII—VII in FIG. 1.

The lower carrier sub-assembly 16 doubles as a heat-sink for the mother chip 12. It is formed from extruded aluminum, and includes tapped screw holes 64, or an equivalent fastening mechanism, for mounting to the micro-printed circuit board 20 (FIGS. 2 and 7). The special non-smearing heat sink compound 32 is used as filler material between the lower carrier sub-assembly 16 and the backside of the mother chip 12. Use of this compound 32 ensures excellent heat transfer between the mother chip 12 and the aluminum base of the sub-assembly 16.

Once the mother chip 12 is mounted onto the lower carrier sub-assembly 16, the guide pins 62 protrude through mother chip 12 to accept the daughter chips 30, as shown in FIG. 2. The guide pins 62 preferably rise 0.20" above the surface of the mother chip 12 to ensure proper contact with the daughter chip 30. When combined, the guide pins 62 also align with the notches 60 on the daughter chips 30 to ensure proper alignment and polarization of the daughter chips 30 to the mother chip 12, as mentioned above.

The daughter chips 30 are thus positioned in place in their respective parking spots 46 on the mother chip 12 (FIG. 4). The semi-circular notches 60 cut into the perimeter of each daughter chip 30 align perfectly with the pattern of guide pins 62 positioned around each parking spot 46. Once in place, the gold bumps 36 of the daughter chips 30 will contact and align directly on top of the gold bumps 38 on the mother chip 12 and thus are in position to form the necessary gas-tight electrical contacts.

The top carrier sub-assembly 14 is then positioned over the entire lower assembly (including the mother chip 12 and the seated daughter chips 30) and secured into place. The top carrier sub-assembly 14 is designed to serve several functions. Like the lower carrier sub-assembly, it is also made from aluminum, and thus provides additional cooling to the integrated circuit assembly 10. The inside surface also houses a special wafer spring 66 (FIG. 7) that applies the necessary pressure to the daughter chips 30 to ensure the gas-tight connections to the mother chip 12. As will be discussed below, a mechanical ferrule may also be built into the top carrier sub-assembly 16 to support connection to an external device such as an optical fiber bundle or other communication means.

In one preferred embodiment, the wafer spring 66 is configured to apply uniform pressure to each daughter chip 30 in order to create the proper gas-tight, electrically conductive connection between the gold bumps 36 on the daughter chips 30, and the gold bumps 38 on mother chip 12. It is the pressure of the wafer spring 66 that causes the slight deformity of the gold bumps 36, 38 and ensures the gas-tight seal. The proper pressure required by the spring 66 is provided when the final assembly screws 68 are tightened to connect the upper and lower sub-assemblies 14, 16.

Figure 10:
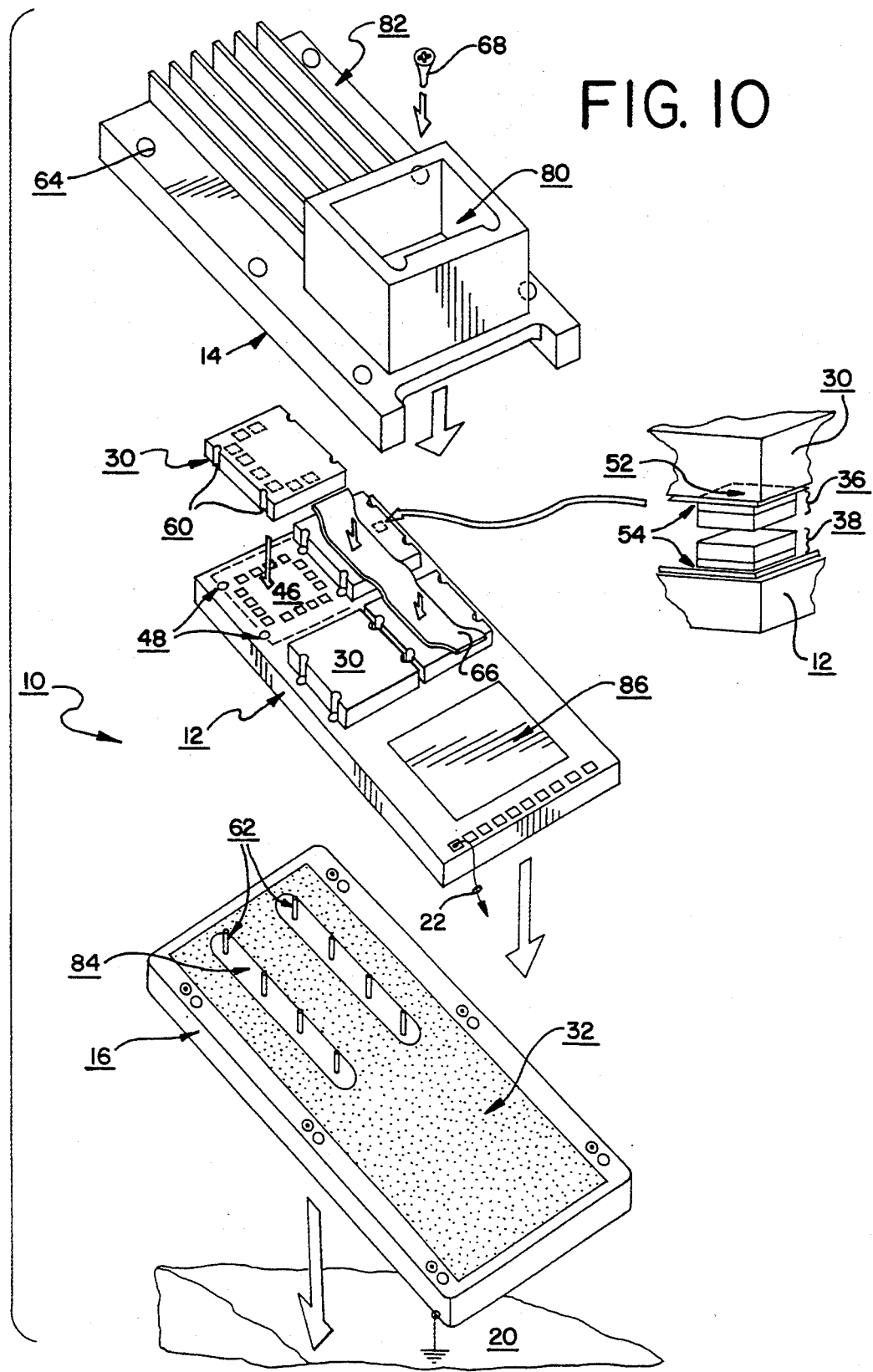
FIG. 10 is an exploded view of one presently preferred embodiment of the integrated circuit assembly of the invention.

In FIG. 10 (where like elements receive like numerals), one preferred embodiment of the integrated circuit assembly 10 of the invention as employed in one specific application is shown. FIG. 10 shows a breakaway view of the various elements of the integrated circuit assembly 10. Mounted on the micro-printed circuit board 20 in this embodiment is the lower carrier sub-assembly 16. Applied to the lower carrier sub-assembly 16 is the special non-smearing heatsink compound 32 mentioned above. The guide pins 62 shown in FIG. 10 are attached as part of a plastic pin strip 84.

Mounted to the lower carrier sub-assembly 16 is also one mother chip 12. The mother chip 12 is electrically connected to the micro-printed circuit board 20 using bond wires 22. Located on the mother chip 12 in this embodiment are four daughter chips 30. These chips 30 are connected to the mother chip 12 according to the process described above, and held in contact by the wafer spring 66. Also provided on the mother chip 12 surface is an optical sense area 86. In one preferred embodiment, this sense area 86 can comprise a storage device such as a static or dynamic random access memory.

Positioned on top of the mother/daughter chip assemble is the upper carrier sub-assembly 14. As mentioned above, the upper carrier sub-assembly 14 includes tapped screw holes 64 for insertion of the final assembly screws 68. Shown in FIG. 10 are the heatsink fins 82 included on the upper carrier sub-assembly 14. Also provided on the upper carrier sub-assembly 14 is a ferrule 80, which provides an opening over the optical sense area 86 included on the mother chip 12.

The ferrule 80, in combination with the optical sense area 86, provides the direct connection interface between the mother chip 12 and external devices mentioned above. In one preferred embodiment of the invention, such external devices may comprise optical devices or the like. These optical devices can, therefore, communicate with the mother chip 12 via a fiber optic bundle (not shown). The fiber optic bundle inserts through the ferrule 80, and connects to the optical sense area 86. Optical devices of the type envisioned for connection to the optical sense area 86 are described in co-pending application Ser. No. 07/517,109, filed Apr. 30, 1990, now U.S. Pat. No. 5,258,858, by the same inventor, the contents of which are expressly incorporated herein by reference.

As those skilled in the art will appreciate that any dimensions for the integrated circuit assembly 10 will be dictated by the specific application, however, dimensions for the preferred embodiment shown in FIG. 10 are as follows: the width of the upper carrier sub-assembly 14 is 0.4"; the dimensions of the ferrule 80 are 0.340"×0.270"; the bonding pads 52, 54 are industry standard 4 mils on a side; the thickness of the gold bumps 36, 38 deposited on the titanium-tungsten barrier metal 54 is preferably 0.001 inches; and the daughter chip 30 die size in this embodiment is 0.350×0.350 inches.

Once the sub-assembly is assembled, the integrated circuit module 10 can be easily tested. After tests of the IC assembly 10 are complete, the module is ready for final assembly and can be screwed or fastened onto the micro-printed circuit board 20. A minimum number of connections (e.g. wire-wrap pins 24 in FIG. 1) are employed to connect approximately six signals between the IC assembly 10 and any host printed circuit board (not shown). After all testing is complete, the coating of silastic 18 is applied to seal the integrated circuit assembly 10. This coating 18 protects the mother/daughter chip combination from external contamination due to moisture or the like.

A typical product built with the integrated circuit assembly 10 of this invention will be inherently small, and will appear to include only a few electronic components. When such a product is opened, these few components (battery, switches, lights, etc.) will be mounted to a small, relatively unpopulated printed circuit board. Located somewhere on this printed circuit board, however, will be the IC assembly 10.

On site repairability of the integrated circuit assembly 10 is one advantage of the gas-tight contact mechanism employed in this invention. This gas-tight approach does not require permanent soldered interfaces between the connecting surfaces of the mother and daughter chips, and thus separation for replacement is easily accomplished after removal of the sealant and the upper carrier sub-assembly. Since these components are compression fitted, only minor disassembly is required to replace a defective daughter chip.

A further advantage of the gas-tight contact system of this invention is the use of a pliable conductor such as gold between the mother and daughter chips. Gold, or other equivalent pliable connectors, eliminate problems of stress and strain experienced when two dissimilar metals expand and contract against each other due to thermal and environmental variations.

It is to be understood that a wide range of changes and modifications to the embodiments described above will be apparent to those skilled in the art, and are also contemplated. It is therefore intended that the foregoing detailed description be regarded as illustrative rather than limiting, and that it be understood that it is the following claims, including all equivalents, that are intended to define the spirit and scope of this invention.

I claim:

1. An apparatus for directly connecting semiconductor integrated circuits, comprising:
 a first semiconductor integrated circuit having a boundary area around its periphery, the boundary area defined by a region of circuit inactivity, the first semiconductor integrated circuit including a plurality of shallow notches cut into the boundary area; and a second semiconductor integrated circuit having a plurality of molded posts extending upward from a first surface of said second integrated circuit the plurality of molded posts disposed to extend around the periphery of the first semiconductor integrated circuit;

wherein the molded posts of the second semiconductor integrated circuit mate with the shallow notches cut into the boundary area of the first semiconductor integrated circuit to retain and align the first semiconductor integrated circuit.

2. The apparatus defined in claim 1, wherein the molded posts of the second semiconductor integrated circuit align with the shallow notches of the first semiconductor integrated circuit and ensure proper alignment of the first semiconductor integrated circuit to the second semiconductor integrated circuit.

3. The apparatus defined in claim 1, wherein the shallow notches of the first semiconductor integrated circuit and the molded posts of said second semiconductor integrated circuit are disposed in a predetermined fashion to ensure proper polarization of the first semiconductor integrated circuit to the second semiconductor integrated circuit.

4. The apparatus defined in claim 1, wherein the second semiconductor integrated circuit further comprises a plurality of apertures and the plurality of molded posts extend through the apertures.

5. The apparatus defined in claim 4, wherein the moldedposts extend from a base.

6. The apparatus defined in claim 5, wherein the base is coupled to the second semiconductor integrated circuit.

7. The apparatus defined in claim 1, wherein the molded posts comprise aluminum.

8. The apparatus defined in claim 1, wherein the molded posts comprise plastic.

9. The apparatus defined in claim 1, wherein the inactive area comprises a scribe area of the first semiconductor integrated circuit.

10. The apparatus defined in claim 1, wherein the shallow notches penetrate at least three mils into the boundry area of said first semiconductor integrated circuit.

11. The apparatus defined in claim 1, further comprising an optical sensing element disposed on the second semiconductor integrated circuit, and a ferrule providing an aperture over the optical sense element.

12. The apparatus defined in claim 11, wherein the optical sensing element comprises a randomly accessible memory.

13. An apparatus for directly connecting semiconductor integrated circuits, comprising:

a first semiconductor integrated circuit having a boundary area around its periphery, the boundary area defined by a region of circuit inactivity, the first semiconductor integrated circuit including a plurality of shallow notches cut into the boundary area and a first plurality of bonding regions disposed on at least one surface of the first semiconductor integrated circuit;

a first malleable, electrically conductive connector deposited on each of the first plurality of bonding regions;

a second semiconductor integrated circuit including a plurality of molded posts extending upwardly from a first surface of the second semiconductor integrated circuit and around rite: periphery of the first semiconductor integrated circuit that mate with the shallow notches of the first semiconductor integrated circuit to retain and align the first semiconductor integrated circuit, and a second plurality of bonding regions disposed on at least one side of the second semiconductor integrated circuit; and a second malleable, electrically conductive connector deposited on each of the second plurality of bonding regions, wherein the two semiconductor integrated circuits are biased to deform at least one of the malleable, electrically conductive connectors.

14. The apparatus defined in claim 13, wherein the first plurality of bonding regions comprise a first plurality of bonding pads and the second plurality of bonding regions comprise a second plurality of bonding pads.

15. A method for coupling a first semiconductor integrated circuit including a first plurality of bonding regions to a second semiconductor integrated circuit including a second plurality of bonding regions, comprising the steps of:

depositing a first malleable, electrically conductive connector onto the first plurality of bonding regions;

depositing a second malleable, electrically conductive connector onto the second plurality of bonding regions;

cutting a plurality of shallow notches within an electrically inactive region around the periphery of the first semiconductor integrated circuit;

positioning molded posts extending upwardly from a first surface of the second semiconductor integrated circuit in predetermined positions around the periphery of the first semiconductor integrated circuit;

orienting the first semiconductor integrated circuit so that the first plurality of bonding regions align with the second plurality of bonding regions, and the shallow notches of the first semiconductor integrated circuit align with the molded posts of the second semiconductor integrated circuit; and biasing the first semiconductor integrated circuit toward the second semiconductor integrated circuit so that the first malleable, electrically conductive connector abuts the second malleable, electrically conductive connector resulting in the deformation of at least the first malleable, electrically conductive connector, and the molded posts of the second semiconductor integrated circuit mate with the shallow notches of the first semiconductor integrated circuit to retain the alignment of the first semiconductor integrated circuit.

16. The method defined in claim 15, wherein both the first and second malleable, electrically conductive connectors deform.

17. The method defined in claim 15, wherein the first malleable, electrically conductive connector is aligned to the second malleable, electrically conductive connector.

18. The method defined in claim 15, wherein a gas-tight interface is created between the first and second malleable, electrically conductive connectors.

19. The method defined in claim 15, wherein an initial compression force is employed to deform the first and second malleable, electrically conductive connectors.

20. The method defined in claim 15, wherein the initial compression force is removed and a lesser seating force is applied to maintain contact between the first and second malleable, electrically conductive connectors.

21. The method defined in claim 15, wherein the first and second malleable, electrically conductive connectors comprise gold.

22. The method defined in claim 15, wherein the first and second malleable, electrically conductive connectors are from a group consisting of gold, silver, solder, copper and indium, and alloys thereof.

23. The method defined in claim 15, wherein the first plurality of bonding regions are positioned around the periphery of the first semiconductor integrated circuit, and the second plurality of bonding regions are positioned on the second semiconductor integrated circuit to mirror the first plurality of bonding regions.

24. The method defined in claim 15, wherein the first and second malleable, electrically conductive connectors comprise raised bumps.

25. The method defined in claim 24, wherein the raised bumps further comprise a ridge disposed around the periphery of the bump.

26. A method for coupling a first semiconductor integrated circuit to a second semiconductor integrated circuit, comprising the steps, of:
cutting a plurality of shallow notches within an electrically inactive region around the periphery of the first semiconductor integrated circuit;
positioning molded posts extending upwardly from a first surface of the second semiconductor integrated circuit in predetermined positions around the periphery of the first semiconductor integrated circuit;
orienting the first semiconductor integrated circuit so that the shallow notches of the first semiconductor integrated circuit align with the molded posts of the second semiconductor integrated circuit; and
biasing the first semiconductor integrated circuit toward the second semiconductor integrated circuit so that the molded posts of the second semiconductor integrated circuit mate with the shallow notches of the first semiconductor integrated circuit to retain the alignment of the first semiconductor integrated circuit.

27. The method defined in claim 26, wherein the molded posts of the second semiconductor integrated circuit align with the shallow notches of the first semiconductor integrated circuit and ensure proper alignment of the first malleable, electrically conductive connector to the second malleable, electrically conductive connector.

28. The method defined in claim 26, wherein the shallow notches of the first semiconductor integrated circuit and the molded posts of said second semiconductor integrated circuit are disposed in a predetermined positions to establish polarization of the first semiconductor integrated circuit to the second semiconductor integrated circuit.

29. The method defined in claim 26, wherein the second semiconductor integrated circuit further comprises a plurality of apertures and the plurality of molded posts extend through the apertures.

30. The method defined in claim 29, wherein the molded posts extend from a base.

31. The method defined in claim 30, wherein the base is coupled to the second semiconductor integrated circuit.

32. The method defined in claim 26, wherein the molded posts comprise aluminum.

33. The method defined in claim 26, wherein the molded posts comprise plastic.

34. The method defined in claim 26, wherein the inactive area comprises a scribe area of the first semiconductor integrated circuit.

35. The method defined in claim 26, wherein the shallow notches penetrate at least three mils into the electrically inactive region of said first semiconductor integrated circuit.

* * * * *

UNITED STATES PATENT AND TRADEMARK OFFICE
CERTIFICATE OF CORRECTION

PATENT NO. : 5,435,734
DATED : July 25, 1995
INVENTOR(S) : Vincent Chow

It is certified that error appears in the above-indentified patent and that said Letters Patent is hereby corrected as shown below:

On Page 2 of the title page, column 2, line 6, after "pp. 25-26." insert --(439/68)--.

On Page 2 of the title page, column 2, line 9, after "p. 4655." insert --(439/64)--.

On Page 2 of the title page, column 2, line 12, after "340-341." insert --(257/777)--.

Col. 11
In claim 5, lines 1 and 2, delete "mol-dedposts" and substitute --molded posts--.

Col. 12
In claim 13, line 17, delete "rite:" and substitute --the--.

Col. 14
In claim 28, line 5, delete "positions" and substitute --position--.

Signed and Sealed this

Thirtieth Day of July, 1996

Attest:

BRUCE LEHMAN

*Attesting Officer*  *Commissioner of Patents and Trademarks*